United States Patent
Iriuda et al.

(10) Patent No.: US 11,885,024 B2
(45) Date of Patent: Jan. 30, 2024

(54) GAS INTRODUCTION STRUCTURE AND PROCESSING APPARATUS

(71) Applicant: Tokyo Electron Limited, Tokyo (JP)

(72) Inventors: Hiroki Iriuda, Yamanashi (JP); Reita Igarashi, Iwate (JP); Kuniyasu Sakashita, Iwate (JP)

(73) Assignee: TOKYO ELECTRON LIMITED, Tokyo (JP)

(*) Notice: Subject to any disclaimer, the term of this patent is extended or adjusted under 35 U.S.C. 154(b) by 177 days.

(21) Appl. No.: 17/472,959

(22) Filed: Sep. 13, 2021

(65) Prior Publication Data

US 2022/0081775 A1 Mar. 17, 2022

(30) Foreign Application Priority Data

Sep. 17, 2020 (JP) .................. 2020-156410

(51) Int. Cl.
| | | |
|---|---|---|
| *C23C 16/455* | (2006.01) | |
| *C23C 16/52* | (2006.01) | |
| *H01L 21/67* | (2006.01) | |
| *H01L 21/02* | (2006.01) | |

(52) U.S. Cl.
CPC ........ *C23C 16/52* (2013.01); *C23C 16/45546* (2013.01); *C23C 16/45563* (2013.01); *H01L 21/0228* (2013.01); *H01L 21/67017* (2013.01)

(58) Field of Classification Search
CPC ........ C23C 16/45546; C23C 16/45563; C23C 16/45578; H01L 21/67757
See application file for complete search history.

(56) References Cited

U.S. PATENT DOCUMENTS

| | | | | |
|---|---|---|---|---|
| 2004/0025786 | A1* | 2/2004 | Kontani | H01J 37/3244 118/715 |
| 2005/0223985 | A1* | 10/2005 | Blomiley | C30B 31/18 118/725 |
| 2007/0034158 | A1* | 2/2007 | Nakaiso | C23C 16/45578 118/725 |
| 2012/0280369 | A1* | 11/2012 | Saito | H01L 28/60 257/629 |
| 2013/0255784 | A1* | 10/2013 | Ye | C23C 16/45574 137/561 A |
| 2014/0038394 | A1* | 2/2014 | Watanabe | C23C 16/303 118/725 |
| 2017/0253971 | A1* | 9/2017 | Kawamorita | C23C 16/45561 |

FOREIGN PATENT DOCUMENTS

JP     2011-135044 A     7/2011

* cited by examiner

*Primary Examiner* — Joseph A Miller, Jr.
(74) *Attorney, Agent, or Firm* — Venjuris, P.C.

(57) ABSTRACT

A gas introduction structure extends in a longitudinal direction of a processing container having a substantially cylindrical shape to supply gas into the processing container. The gas introduction structure includes an introduction section that partitions an introduction chamber, an ejection section that partitions a plurality of ejection chambers each including a plurality of gas holes through which the gas is ejected into the processing container, and a branch section that partitions a branch chamber connected to the introduction chamber. The branch chamber is branched to correspond to the number of ejection chambers in a tournament manner and connected to the ejection chambers.

13 Claims, 10 Drawing Sheets

GAS INTRODUCTION STRUCTURE AND PROCESSING APPARATUS

CROSS-REFERENCE TO RELATED APPLICATIONS

This application is based on and claims priority from Japanese Patent Application No. 2020-156410, filed on Sep. 17, 2020 with the Japan Patent Office, the disclosure of which is incorporated herein in its entirety by reference.

TECHNICAL FIELD

The present disclosure relates to a gas introduction structure and a processing apparatus.

BACKGROUND

A film forming apparatus including a gas dispersion nozzle that extends in a vertical direction along the inner side of a sidewall of a cylindrical processing container has been known. The gas dispersion nozzle includes a plurality of gas ejection holes formed over a vertical length thereof corresponding to the wafer support range of a wafer boat (see, e.g., Japanese Patent Laid-Open Publication No. 2011-135044).

SUMMARY

A gas introduction structure according to an aspect of the present disclosure is a gas introduction structure extending in a longitudinal direction of a processing container having a substantially cylindrical shape to supply a gas into the processing container. The gas introduction structure including an introduction section that partitions an introduction chamber, an ejection section that partitions a plurality of ejection chambers each including a plurality of gas holes through which a gas is ejected into the processing container, and a branch section that partitions a branch chamber connected to the introduction chamber, branched corresponding to the number of ejection chambers in a tournament manner, and connected to the dejection chambers.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
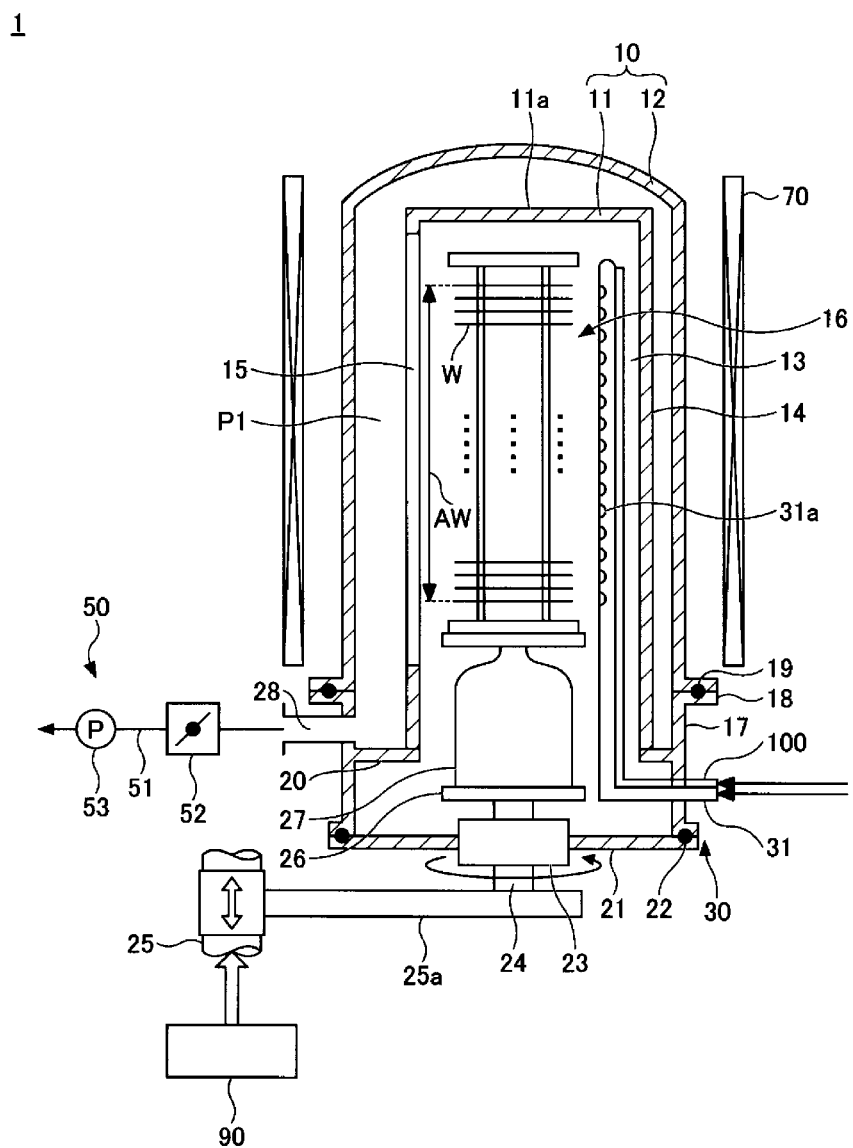
FIG. 1 is a schematic diagram illustrating an example of a processing apparatus according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, a non-limiting exemplary embodiment of the present disclosure will be described with reference to the accompanying drawings. Throughout the accompanying drawings, the same or corresponding members or parts will be denoted by the same or corresponding reference numerals, and the redundant descriptions thereof will be omitted.

[Processing Apparatus]

An example of a processing apparatus according to an embodiment will be described with reference to FIG. 1. FIG. 1 is a schematic diagram illustrating an example of a processing apparatus according to an embodiment.

The processing apparatus 1 includes a processing container 10, a gas supply 30, an exhauster 50, a heater 70, and a controller 90.

The processing container 10 includes an inner tube 11 and an outer tube 12. The inner tube 11 is formed in a substantially cylindrical ceilinged shape having an open lower end. The inner tube 11 has a ceiling portion 11a formed in, for example, a flat shape. The outer tube 12 is formed in a substantially cylindrical shape with a ceiling having its lower end opened and covering the outer side of the inner tube 11. The inner tube 11 and the outer tube 12 are coaxially arranged to have a double tube structure. The inner tube 11 and the outer tube 12 are made of, for example, a heat-resistant material such as quartz.

On one side of the inner tube 11, an accommodation portion 13 is formed to accommodate a gas nozzle. In the accommodation portion 13, a convex portion 14 is formed by protruding a portion of a side wall of the inner tube 11 toward the outside, and the inside of the convex portion 14 is formed as the accommodation portion 13.

A rectangular exhaust slit 15 is formed along its longitudinal direction (vertical direction) on the side wall on the opposite side of the inner tube 11 which faces the accommodation portion 13. The exhaust slit 15 exhausts a gas within the inner tube 11. The length of the exhaust slit 15 is the same as the length of a boat 16 to be described later, or is greater than the length of the board 16 so that the exhaust slit 15 extends upward and downward respectively from the boat 16.

The processing container 10 accommodates the boat 16. The boat 16 holds a plurality of substrates substantially horizontally at intervals in the vertical direction. The substrates may be referred to as, for example, a semiconductor wafer (hereinafter also referred to as "wafer W").

The lower end of the processing container 10 is supported by a substantially cylindrical manifold 17 made of, for example, stainless steel. A flange 18 is formed at the upper end of the manifold 17, and the lower end of the outer tube 12 is provided on and supported by the flange 18. A sealing member 19 such as an O-ring is interposed between the flange 18 and the lower end of the outer tube 12 to keep the inside of the outer tube 12 in an airtight state.

An annular support 20 is provided on the inner wall of the upper portion of the manifold 17. The support 20 supports the lower end of the inner tube 11. A cover 21 is airtightly attached to an opening in the lower end of the manifold 17 via a sealing member 22 such as an O-ring. The cover 21 airtightly closes an opening in the lower end of the processing container 10, i.e., the opening in the manifold 17. The cover 21 is made of, for example, stainless steel.

A rotating shaft 24 is provided through the center of the cover 21 to rotatably support the boat 16 via a magnetic fluid seal 23. A lower portion of the rotating shaft 24 is rotatably supported by an arm 25a of a lifting mechanism 25 including a boat elevator.

A rotating plate 26 is provided at the upper end of the rotating shaft 24. The boat 16 is disposed on the rotating plate 26 to hold a wafer W via a thermal insulator 27 made of quartz. Accordingly, the cover 21 and the boat 16 are adapted to move vertically as a unitary body by raising and lowering the lifting mechanism 25, thereby enabling the boat 16 to be inserted and separated with respect to the inside of the processing container 10.

The gas supply 30 has a tournament nozzle 100 and a dispersion nozzle 31. The tournament nozzle 100 and the dispersion nozzle 31 are arranged within the accommodation portion 13 of the inner tube 11 along the circumferential direction.

The tournament nozzle 100 extends in the longitudinal direction of the inner tube 11 to eject a raw material gas into the inner tube 11. The raw material gas may be, for example, a gas containing silicon (Si) or a metal. Details of the tournament nozzle 100 will be described later.

The dispersion nozzle 31 is provided within the inner tube 11 along the longitudinal direction thereof, and the base of the dispersion nozzle 31 is bent in an L-shape and is supported through the manifold 17. The dispersion nozzle 31 is provided with a plurality of gas holes 31a at predetermined intervals along the longitudinal direction thereof. The gas holes 31a are oriented toward, for example, a center C of the inner tube 11 (wafer W side).

The dispersion nozzle 31 ejects a reactive gas, an etching gas, and a purge gas from the gas holes 31a toward the wafer W substantially horizontally. The reactive gas is a gas for generating a reaction product by reacting with the raw material gas, and may be, for example, a gas containing oxygen or nitrogen. The etching gas is a gas for etching various films, and may be, for example, a gas containing a halogen such as fluorine, chlorine or bromine. The purge gas is a gas for purging the raw material gas or the reactive gas remaining within the processing container 10, and may be, for example, an inert gas.

The exhauster 50 exhausts a gas which is discharged from the inside of the inner tube 11 through the exhaust slit 15 and is then discharged from a gas outlet 28 through a space P1 between the inner tube 11 and the outer tube 12. The gas outlet 28 is formed in a sidewall of the upper portion of the manifold 17 above the support 20. An exhaust passage 51 is connected to the gas outlet 28. A pressure regulation valve 52 and a vacuum pump 53 are sequentially interposed in the exhaust passage 51 to enable the exhaust of the gas from the inside of the processing container 10.

The heater 70 is provided around the outer tube 12. The heater 70 is provided on, for example, a base plate (not illustrated). The heater 70 has a substantially cylindrical shape so as to cover the outer tube 12. The heater 70 includes, for example, a heating element to heat the wafer W within the processing container 10.

The controller 90 controls an operation of each component of the processing apparatus 1. The controller 90 may be, for example, a computer. A computer program for the implementation of an operation of each component of the processing apparatus 1 is stored in a storage medium. The storage medium may be, for example, a flexible disk, a compact disk, a hard disk, a flash memory, or a DVD.

[Nozzle]

Figure 2:
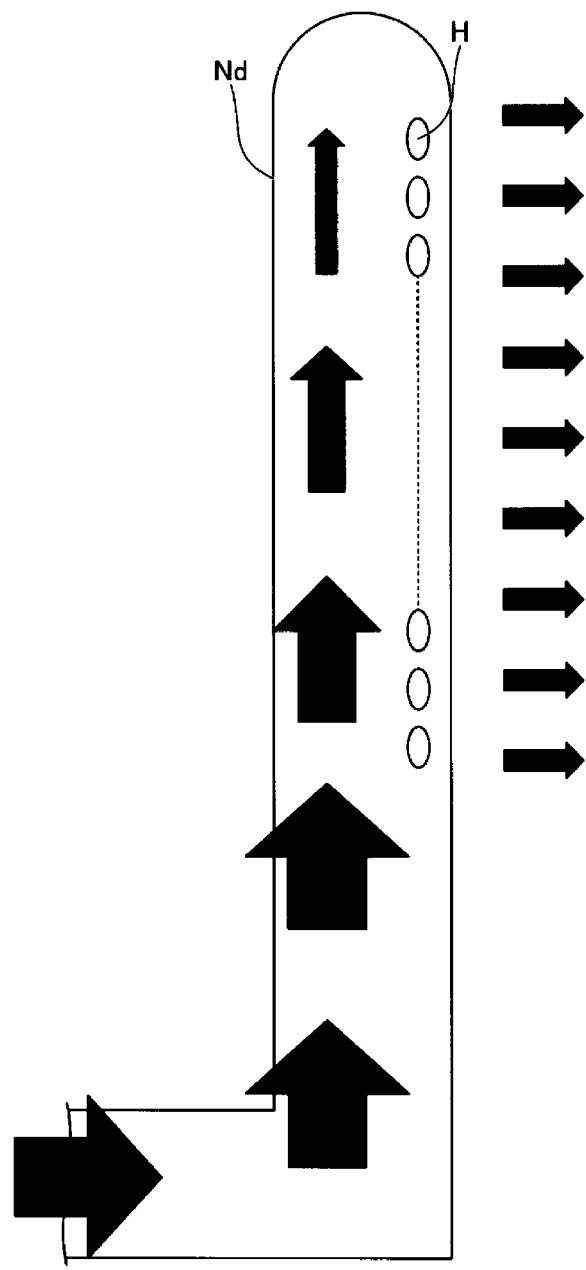
FIG. 2 is a diagram illustrating an example of a dispersion nozzle.

First, a dispersion nozzle will be described with reference to FIG. 2. FIG. 2 is a diagram illustrating an example of a dispersion nozzle. In FIG. 2, arrows indicate the flow of a gas, and are represented thicker as the flow rate of the gas is larger.

In a batch type vertical heat treatment apparatus, a dispersion nozzle in which a plurality of gas holes are provided at positions corresponding to respective wafers is used for the purpose of uniformly supplying a raw material gas to all of the wafers. For example, as illustrated in FIG. 2, a dispersion nozzle Nd is a tubular member which extends vertically and is made of, for example, quartz. A plurality of gas holes H are formed in a vertical portion of the dispersion nozzle Nd over the vertical length thereof corresponding to the wafer support range. Thus, a raw material gas may be ejected from each gas hole H toward the surface of each wafer in the horizontal direction.

However, in the dispersion nozzle Nd, the raw material gas is sequentially distributed from the upstream side of the gas flow (a lower portion of the dispersion nozzle Nd), and the gas flow rate decreases toward the downstream side of the gas flow (an upper portion of the dispersion nozzle Nd). Thus, the flow rate becomes slower toward the downstream side, in addition to the difference in path length. As compared with the upstream side where the path length is short and the flow rate is high, the residence time of the raw material gas is longer at the upstream side where the path length is long and the flow rate is slow, which causes a rapid increase in the decomposition degree of the raw material gas. Therefore, the concentration of reactive species tends to increase on the downstream side of the gas flow.

Figure 3:
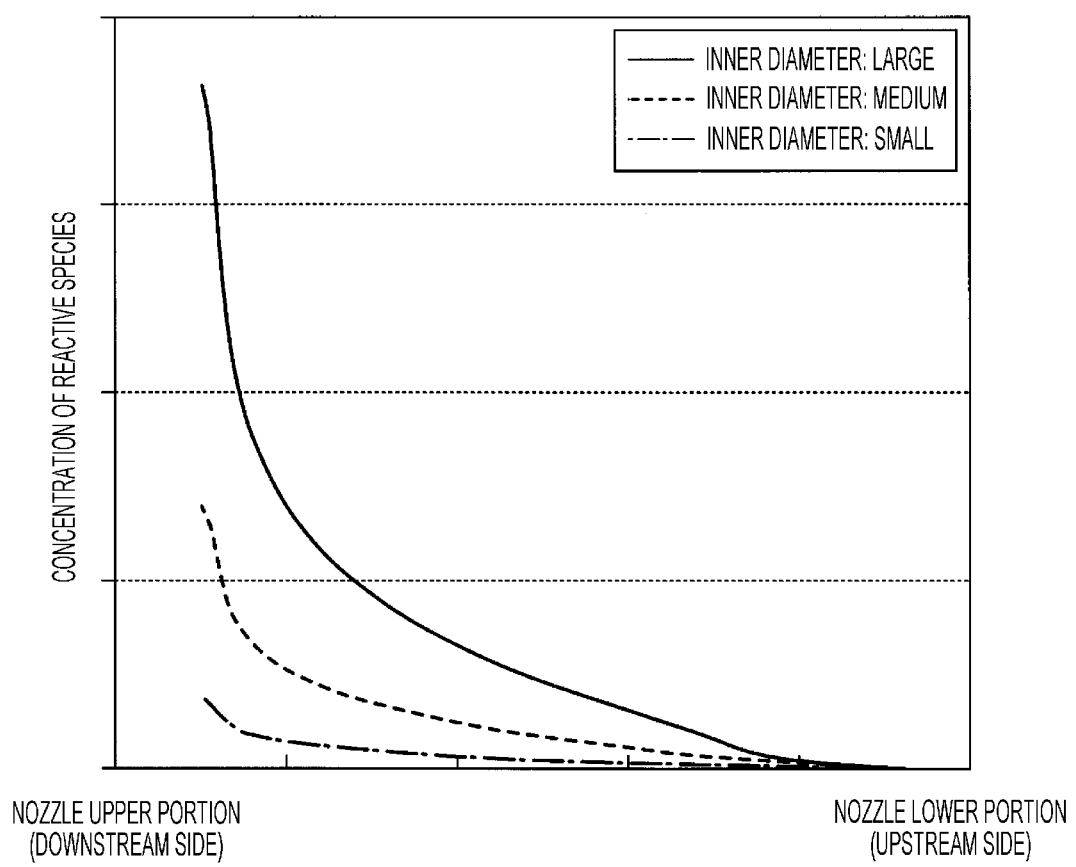
FIG. 3 is a diagram illustrating a relationship between the position of the dispersion nozzle in the height direction and the concentration of reactive species.

FIG. 3 is a diagram illustrating a relationship between the position of the dispersion nozzle Nd in the height direction and the concentration of reactive species. In FIG. 3, the horizontal axis represents the position of the dispersion nozzle Nd in the height direction, and the vertical axis represents the concentration of reactive species within the dispersion nozzle Nd. As illustrated in FIG. 3, when the raw material gas is ejected from the dispersion nozzle Nd, the concentration of reactive species is higher at the upper portion of the dispersion nozzle Nd. The difference in the concentration of reactive species between the upper portion and the lower portion of the dispersion nozzle Nd is reduced when the inner diameter of the dispersion nozzle Nd is reduced, but it is difficult to create a uniform concentration distribution of reactive species in the entire range from the upper portion to the lower portion of the dispersion nozzle Nd.

Figure 4:
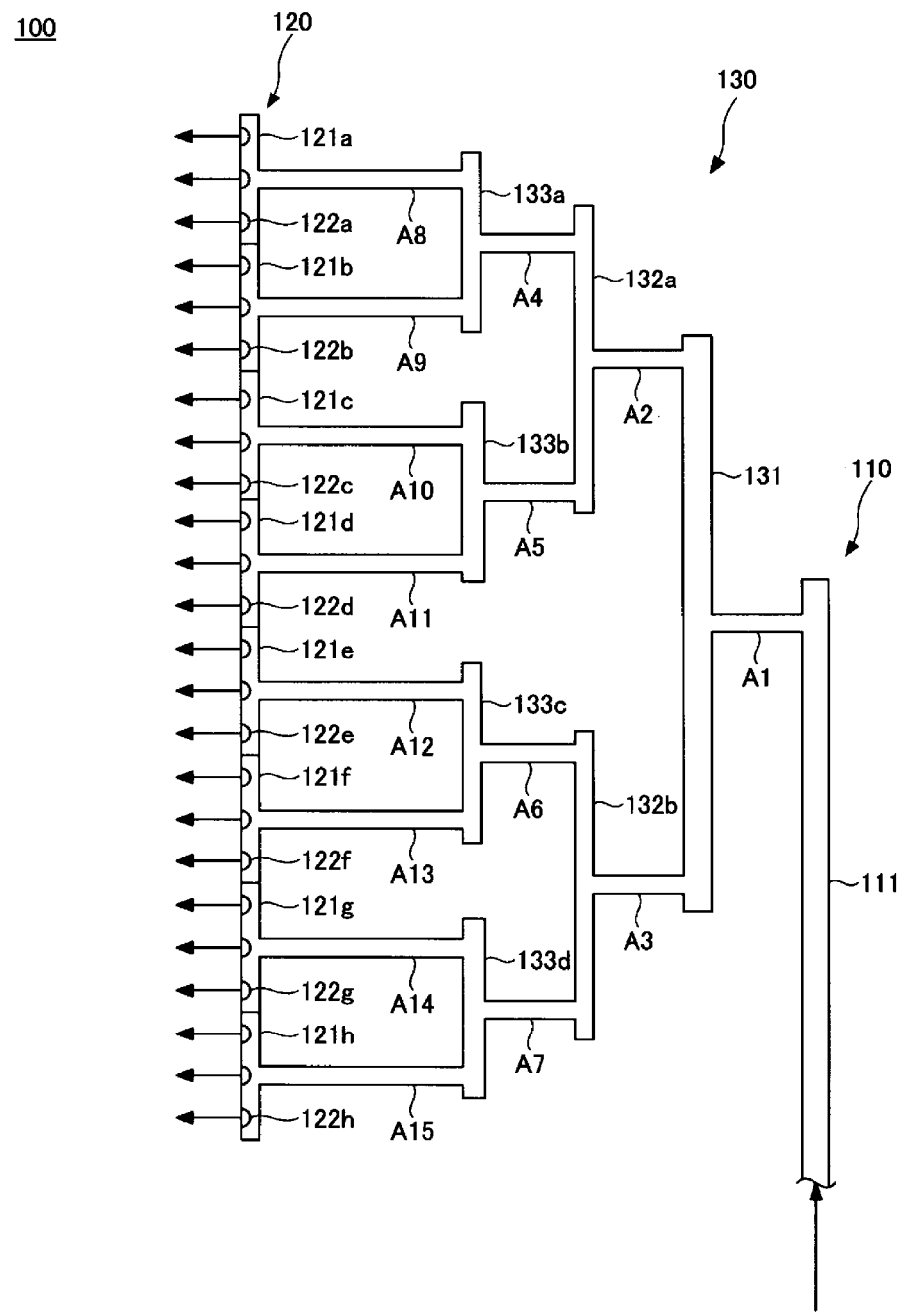
FIG. 4 is a diagram illustrating an example of a tournament nozzle.

Next, the tournament nozzle 100 in the processing apparatus 1 of FIG. 1 will be described with reference to FIG. 4.

The tournament nozzle 100 supplies a raw material gas introduced from a raw material gas source (not illustrated) into the inner tube 11. The tournament nozzle 100 includes an introduction section 110, an ejection section 120, and a branch section 130.

The introduction section 110 partitions an introduction chamber 111. The raw material gas is introduced into the introduction chamber 111 from the raw material gas source.

The ejection section 120 partitions eight ejection chambers 121a to 121h. The eight ejection chambers 121a to 121h are arranged in this order along the longitudinal direction of the processing container 10. The ejection chamber 121a is provided with a plurality of gas holes 122a through which the raw material gas is ejected into the inner tube 11. The gas holes 122a are arranged at intervals along the longitudinal direction of the processing container 10. The gas holes 122a are oriented toward, for example, the center C side of the inner tube 11 to eject the raw material gas introduced into the ejection chamber 121a toward the wafer W. The ejection chambers 121b to 121h are also provided with a plurality of gas holes 122b to 122h, respectively, similarly to the ejection chamber 121a.

The branch section 130 partitions branch chambers 131, 132a, 132b, and 133a to 133d. The branch chambers 131, 132a, 132b, and 133a to 133d are connected to the introduction chamber 111, and are branched in a tournament manner to correspond to the number of eight ejection chambers 121a to 121h and be connected to the eight ejection chambers 121a to 121h.

The branch chamber 131 communicates with the introduction chamber 111 in the upstream side of the gas flow, and communicates with the branch chambers 132a and 132b in the downstream side of the gas flow. The branch chamber 131 branches the raw material gas introduced from the introduction chamber 111 into two branch chambers 132a and 132b. Hereinafter, a portion where the branch chamber 131 and the introduction chamber 111 communicate with each other is referred to as a communication portion A1, and portions where the branch chamber 131 and the branch chambers 132a and 132b communicate with each other are referred to as communication portions A2 and A3, respectively. The branch chamber 131 may be formed such that the conductance of a path from the communication portion A1 to the communication portion A2 and the conductance of a path from the communication portion A1 to the communication portion A3 are the same, and for example, has a symmetrical structure with respect to a horizontal plane including the communication portion A1. Thus, the raw material gas introduced into the branch chamber 131 may be equally branched into the branch chamber 132a and the branch chamber 132b.

The branch chamber 132a communicates with the branch chamber 131 via the communication portion A2 in the upstream side of the gas flow, and communicates with the branch chambers 133a and 133b in the downstream side of the gas flow. Hereinafter, portions where the branch chamber 132a and the branch chambers 133a and 133b communicate with each other are referred to as communication portions A4 and A5, respectively. The branch chamber 132a may be formed such that the conductance of a path from the communication portion A2 to the communication portion A4 and the conductance of a path from the communication portion A2 to the communication portion A5 are the same, and for example, has a symmetrical structure with respect to a horizontal plane including the communication portion A2. Thus, the raw material gas introduced into the branch chamber 132a may be equally branched into the branch chamber 133a and the branch chamber 133b.

The branch chamber 132b is located below the branch chamber 132a. The branch chamber 132b communicates with the branch chamber 131 via the communication portion A3 in the upstream side of the gas flow, and communicates with the branch chambers 133c and 133d in the downstream side of the gas flow. Hereinafter, portions where the branch chamber 132b and the branch chambers 133c and 133d communicate with each other are referred to as communication portions A6 and A7, respectively. The branch chamber 132b may be formed such that the conductance of a path from the communication portion A3 to the communication portion A6 and the conductance of a path from the communication portion A3 to the communication portion A7 are the same, and for example, has a symmetrical structure with respect to a horizontal plane including the communication portion A3. Thus, the raw material gas introduced into the branch chamber 132b may be equally branched into the branch chamber 133c and the branch chamber 133d.

The branch chamber 133a communicates with the branch chamber 132a via the communication portion A4 in the upstream side of the gas flow, and communicates with the ejection chambers 121a and 121b in the downstream side of the gas flow. Hereinafter, portions where the branch chamber 133a and the ejection chambers 121a and 121b communicate with each other are referred to as communication portions A8 and A9, respectively. The branch chamber 133a may be formed such that the conductance of a path from the communication portion A4 to the communication portion A8 and the conductance of a path from the communication portion A4 to the communication portion A9 are the same, and for example, has a symmetrical structure with respect to a horizontal plane including the communication portion A4. Thus, the raw material gas introduced into the branch chamber 133a may be equally branched into the ejection chamber 121a and the ejection chamber 121b.

The branch chamber 133b is located below the branch chamber 133a. The branch chamber 133b communicates with the branch chamber 132a via the communication portion A5 in the upstream side of the gas flow, and communicates with the ejection chambers 121c and 121d in the downstream side of the gas flow. Hereinafter, portions where the branch chamber 133b and the ejection chambers 121c and 121d communicate with each other are referred to as communication portions A10 and A11, respectively. The branch chamber 133b may be formed such that the conductance of a path from the communication portion A5 to the communication portion A10 and the conductance of a path from the communication portion A5 to the communication portion A11 are the same, and for example, has a symmetrical structure with respect to a horizontal plane including the communication portion A5. Thus, the raw material gas introduced into the branch chamber 133b may be equally branched into the ejection chamber 121c and the ejection chamber 121d.

The branch chamber 133c is located below the branch chamber 133b. The branch chamber 133c communicates with the branch chamber 132b via the communication portion A6 in the upstream side of the gas flow, and communicates with the ejection chambers 121e and 121f in the downstream side of the gas flow. Hereinafter, portions where the branch chamber 133c and the ejection chambers 121e and 121f communicate with each other are referred to as communication portions A12 and A13, respectively. The branch chamber 133c may be formed such that the conductance of a path from the communication portion A6 to the communication portion A12 and the conductance of a path from the communication portion A6 to the communication portion A13 are the same, and for example, has a symmetrical structure with respect to a horizontal plane including the communication portion A6. Thus, the raw material gas introduced into the branch chamber 133c may be equally branched into the ejection chamber 121e and the ejection chamber 121f.

The branch chamber 133d is located below the branch chamber 133c. The branch chamber 133d communicates with the branch chamber 132b via the communication portion A7 in the upstream side of the gas flow, and communicates with the ejection chambers 121g and 121h in the downstream side of the gas flow. Hereinafter, portions where the branch chamber 133d and the ejection chambers 121g and 121h communicate with each other are referred to as communication portions A14 and A15, respectively. The branch chamber 133d may be formed such that the conductance of a path from the communication portion A7 to the communication portion A14 and the conductance of a path from the communication portion A7 to the communication portion A15 are the same, and for example, has a symmetrical structure with respect to a horizontal plane including the communication portion A7. Thus, the raw material gas introduced into the branch chamber 133d may be equally branched into the ejection chamber 121g and the ejection chamber 121h.

With the tournament nozzle 100 described above, since the raw material gas follows the same path at the point in time when it is introduced into the eight ejection chambers 121a to 121h, the mass flow rate and decomposition degree of the raw material gas become uniform in each of the ejection chambers 121a to 121h. As a result, the mass flow rate and decomposition degree of the raw material gas may be uniform in the longitudinal direction of the inner tube 11.

In the illustrated example, a case where the raw material gas introduced into the introduction chamber 111 is branched into the eight ejection chambers 121a to 121h in a tournament manner has been described, but the present disclosure is not limited thereto. For example, the raw material gas introduced into the introduction chamber 111 may be branched into 16 ejection chambers in a tournament manner, or may be branched into 32 ejection chambers in a tournament manner In this way, the raw material gas introduced into the introduction chamber 111 may be branched into ejection chambers in the number of the power of 2 in a tournament manner Increasing the number of branched ejection chambers may further increase the uniformity of the mass flow rate and decomposition degree of the raw material gas ejected from a plurality of ejection chambers.

Further, in the tournament nozzle 100, the volume of a space above the communication portion A1 in the introduction chamber 111 may be made as small as possible from the viewpoint of suppressing the occurrence of stagnation of the raw material gas. From the same viewpoint, the volume of the space above the communication portion A2 in the branch chamber 131 and the volume of the space below the communication portion A3 in the branch chamber 131 may be made as small as possible. Further, similarly, the volume of the space at the ends (upper and lower sides) in the branch chambers 132a, 132b, and 133a to 133d may be made as small as possible.

Figure 5:
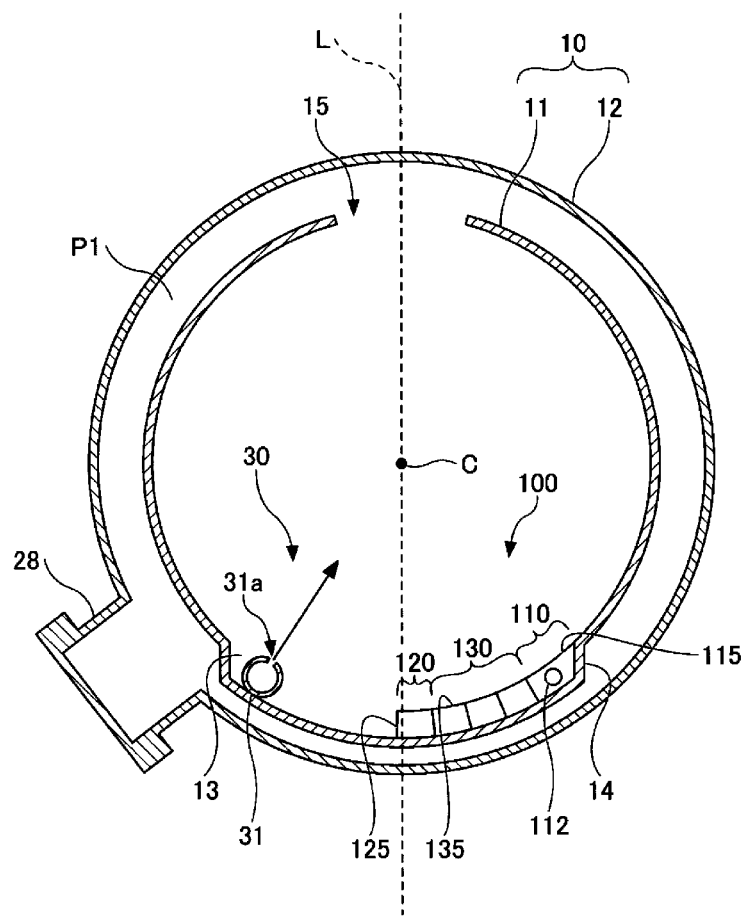
FIG. 5 is a diagram illustrating a specific example of the tournament nozzle.
Figure 6:
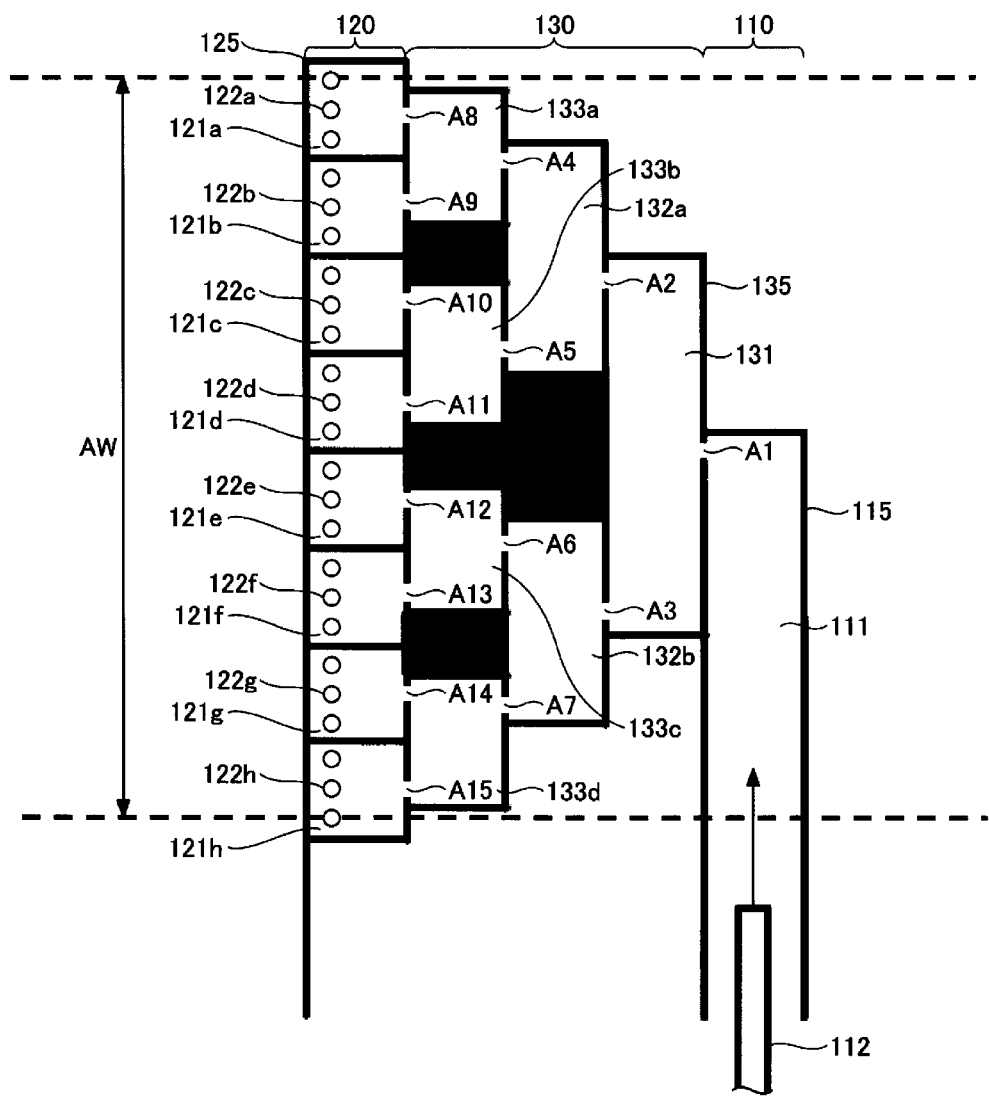
FIG. 6 is a diagram illustrating the specific example of the tournament nozzle.

Next, a specific example of the tournament nozzle 100 of the embodiment will be described with reference to FIGS. 5 and 6. FIG. 5 illustrates a transverse cross-section of the processing container 10 which is a cross section including the tournament nozzle 100. FIG. 6 illustrates a cross-section along the circumferential direction of the processing container 10 which is a cross section including the tournament nozzle 100.

The tournament nozzle 100 is provided within the accommodation portion 13 of the inner tube 11. The tournament nozzle 100 has the introduction section 110, the ejection section 120, and the branch section 130.

The introduction section 110, the branch section 130, and the ejection section 120 are arranged in a line in this order along the circumferential direction within the accommodation portion 13 of the inner tube 11.

The introduction section 110 partitions the introduction chamber 111 by welding a plate member 115 to the inner wall of the inner tube 11. The plate member 115 is made of a material having heat resistance, for example, quartz. The introduction chamber 111 is defined such that the lower end thereof forms an opening adapted to cover the tip of a gas nozzle 112.

The ejection section 120 partitions the eight ejection chambers 121a to 121h by welding a plate member 125 to the inner wall of the inner tube 11. The plate member 125 is made of, for example, the same material as the plate member 115. The plurality of gas holes 122a to 122h are arranged at intervals along the longitudinal direction of the processing container 10. The height range in which the gas holes 122a to 122h are provided may be the same as, for example, the height range of a wafer mounting area AW. The gas holes 122a to 122h are arranged, for example, on a straight line L connecting the center C of the inner tube 11 and the center of the exhaust slit 15.

The branch section 130 partitions the branch chambers 131, 132a, 132b, and 133a to 133d by welding a plate member 135 to the inner wall of the inner tube 11 and the plate members 115 and 125. The plate member 135 is made of, for example, the same material as the plate member 115.

As described above, the tournament nozzle 100 of the embodiment may be manufactured by welding the plate members 115, 125 and 135.

Figure 7:
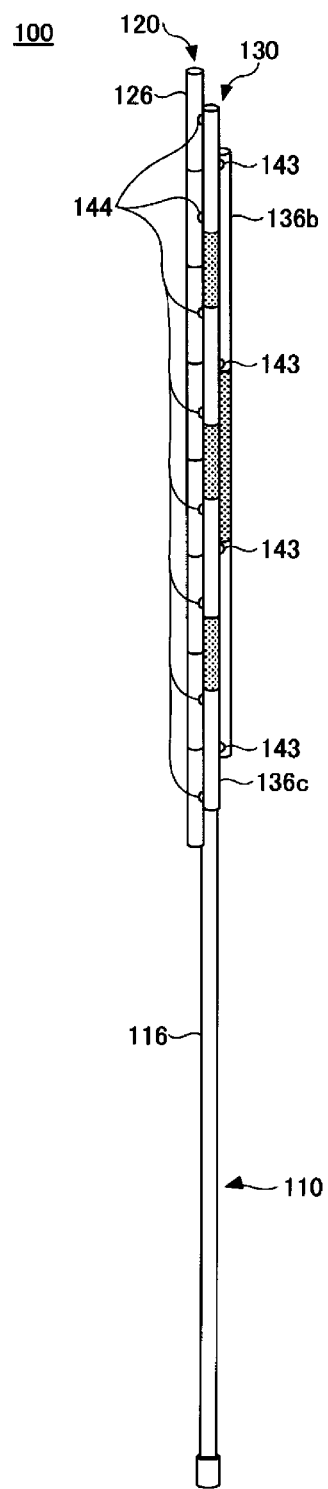
FIG. 7 is a diagram illustrating another specific example of the tournament nozzle.
Figure 8:
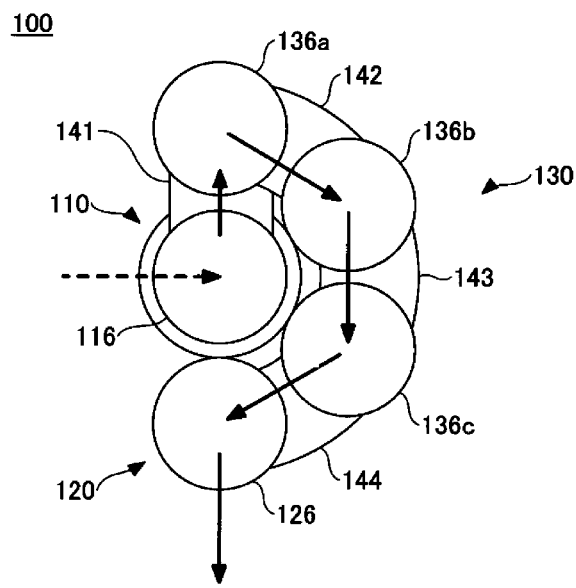
FIG. 8 is a diagram illustrating yet another specific example of the tournament nozzle.

Next, another specific example of the tournament nozzle 100 of the embodiment will be described with reference to FIGS. 7 and 8. In FIG. 8, arrows indicate the flow of a gas.

The tournament nozzle 100 is provided within the accommodation portion 13 of the inner tube 11. The tournament nozzle 100 has the introduction section 110, the ejection section 120, and the branch section 130.

The ejection section 120 and the branch section 130 are disposed around the introduction section 110.

The introduction section 110 partitions the introduction chamber 111 by a tubular member 116. The tubular member 116 is made of a material having heat resistance, for example, quartz.

The branch section 130 partitions the branch chambers 131, 132a, 132b, and 133a to 133d by tubular members 136a to 136c. The tubular member 136a contains one space therein, and the space configures the branch chamber 131. The tubular member 136b contains two spaces separated from each other in the longitudinal direction therein, and the two spaces configure the branch chambers 132a and 132b. The tubular member 136c contains four spaces separated from each other in the longitudinal direction therein, and the four spaces configure the branch chambers 133a to 133d. The tubular members 136a to 136c are made of, for example, the same material as the tubular member 116.

The tubular member 136a is disposed adjacent to the tubular member 116, and is welded to the tubular member 116 via a connection tube 141. The connection tube 141 functions as the communication portion A1.

The tubular member 136b is disposed adjacent to the tubular member 116 and the tubular member 136a, and is welded to the tubular member 136a via a connection tube 142. The connection tube 142 functions as the communication portions A2 and A3.

The tubular member 136c is disposed adjacent to the tubular member 116 and the tubular member 136b, and is welded to the tubular member 136b via a connection tube 143. The connection tube 143 functions as the communication portions A4 to A7.

The ejection section 120 partitions the eight ejection chambers 121a to 121h by a tubular member 126. The tubular member 126 contains eight spaces separated from each other in the longitudinal direction therein, and the eight spaces configure the ejection chambers 121a to 121h. The tubular member 126 is made of, for example, the same material as the tubular member 116. The tubular member 126 is disposed adjacent to the tubular member 116 and the tubular member 136c, and is welded to the tubular member 136c via a connection tube 144. The connection tube 144 functions as the communication portions A8 to A15.

As described above, the tournament nozzle 100 of the embodiment may be manufactured by welding the tubular members 116, 126, and 136a to 136c. Further, in the tournament nozzle 100 of the embodiment, since the tubular members 126 and 136a to 136c are provided around the tubular member 116 with the tubular member 116 as the center, the space occupied by the tournament nozzle 100 may be reduced.

Figure 9:
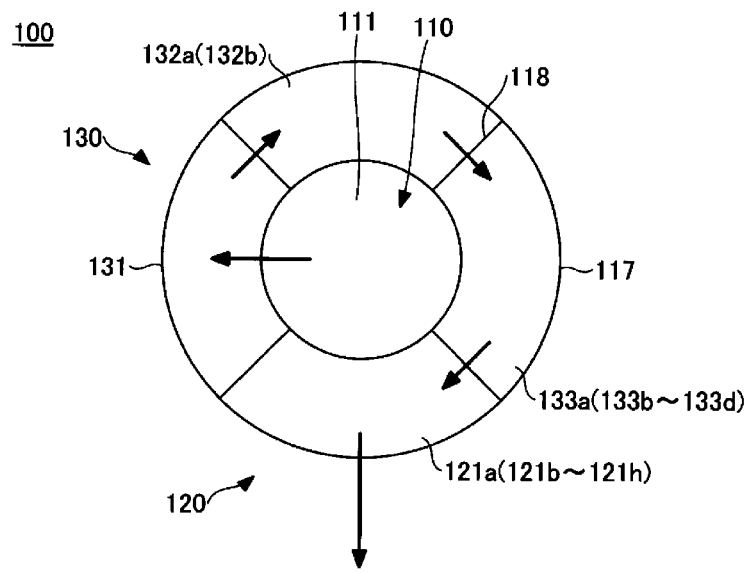
FIG. 9 is a diagram illustrating still yet another specific example of the tournament nozzle.

Next, yet another specific example of the tournament nozzle 100 of the embodiment will be described with reference to FIG. 9. In FIG. 9, arrows indicate the flow of a gas.

The tournament nozzle 100 is provided within the accommodation portion 13 of the inner tube 11. The tournament nozzle 100 has the introduction section 110, the ejection section 120, and the branch section 130.

The ejection section 120 and the branch section 130 are arranged around the introduction section 110.

The introduction section 110, the ejection section 120, and the branch section 130 partition the introduction chamber 111, the ejection chambers 121a to 121h, and branch chambers 131, 132a, 132b, and 133a to 133d by partitioning the inside of one tubular member 117 with partition members 118. The tubular member 117 and the partition members 118 are made of a material having heat resistance, for example, quartz. Through-holes (not illustrated) are formed in the partition members 118, and the through-holes function as the communication portions A1 to A15.

As described above, the tournament nozzle 100 of the embodiment may be manufactured by partitioning the inside of one tubular member 117 with the partition members 118. Further, since the tournament nozzle 100 of the embodiment is manufactured by partitioning the inside of one tubular member 117 with the partition materials 118, the space occupied by the tournament nozzle 100 may be reduced.

[Processing Method]

A method of forming a silicon oxide film on the wafer W according to an atomic layer deposition (ALD) method using the processing apparatus 1 illustrated in FIG. 1 will be described as an example of a processing method of the embodiment.

First, the controller 90 controls the lifting mechanism 25 to carry the boat 16 holding a plurality of wafers W into the processing container 10, and airtightly blocks the opening in the lower end of the processing container 10 by the cover 21 to hermetically seal the processing container 10.

Subsequently, the controller 90 forms a silicon oxide film having a desired film thickness on the wafers W by repeating a cycle including the steps of supplying a raw material gas (S1), purging (S2), supplying a reactive gas (S3), and purging (S4) a predetermined number of times.

In step S1, a silicon containing gas serving as the raw material gas is ejected from the tournament nozzle 100 into the processing container 10, whereby the silicon containing gas is adsorbed to the wafers W.

In step S2, for example, the silicon containing gas remaining in the processing container 10 is discharged by cycle purge in which a gas replacement and a vacuum processing are repeated. The gas replacement is an operation of supplying a purge gas into the processing container 10 from the dispersion nozzle 31. The vacuum processing is an operation of exhausting the gas from the inside of the processing container 10 by the vacuum pump 53. In the gas replacement, the purge gas may be supplied into the processing container 10 from the tournament nozzle 100.

In step S3, an oxidizing gas serving as the reactive gas is ejected from the dispersion nozzle 31 into the processing container 10, whereby the silicon raw material gas adsorbed to the wafers W is oxidized by the oxidizing gas.

In step S4, for example, the oxidizing gas remaining in the processing container 10 is discharged by cycle purge in which a gas replacement and a vacuum processing are repeated. Step S4 may be the same as step S2.

After the ALD cycle including steps S1 to S4 is repeated a predetermined number of times, the controller 90 controls the lifting mechanism 25 to carry the boat 16 out of the inside of the processing container 10.

A method of forming a silicon oxide film on the wafer W according to a chemical vapor deposition (CVD) method using the processing apparatus 1 illustrated in FIG. 1 will be described as another example of the processing method of the embodiment.

First, the controller 90 controls the lifting mechanism 25 to carry the boat 16 holding a plurality of wafers W into the processing container 10, and airtightly blocks the opening in the lower end of the processing container 10 by the cover 21 to hermetically seal the processing container 10.

Subsequently, the controller 90 forms a silicon film having a desired film thickness on the wafer W by ejecting a silicon containing gas serving as the raw material gas into the processing container 10 from the tournament nozzle 100.

Subsequently, the controller 90 controls the lifting mechanism 25 to carry the boat 16 out of the inside of the processing container 10.

According to the embodiment described above, when the raw material gas is ejected into the inner tube 11, the gas is ejected from the tournament nozzle 100. According to the tournament nozzle 100, since the raw material gas follows the same path at the point in time when it is introduced into the eight ejection chambers 121a to 121h, the mass flow rate and decomposition degree of the raw material gas become uniform in each of the ejection chambers 121a to 121h. Therefore, the mass flow rate and decomposition degree of the raw material gas may be uniform in the longitudinal direction of the inner tube 11. As a result, the uniformity of the film thickness (interplanar uniformity) between the plurality of wafers W accommodated in multiple tiers within the processing chamber 10 is improved.

[Simulation Result]

In order to confirm the effects of the tournament nozzle 100 of the embodiment, a simulation by thermofluid analysis is performed with respect to the mass flow rate of the raw material gas ejected from the tournament nozzle and the mole fraction of active species in the vicinity of the tournament nozzle. The reason why the concentration distribution of the reactive species is analyzed is that the film thickness of a predetermined film formed on the wafer W is due to the concentration of the reactive species produced by thermal decomposition of a precursor gas.

In this simulation, the simulation by thermofluid analysis is performed similarly for a dispersion nozzle having an inner diameter of 16 mm and a dispersion nozzle having an inner diameter of 6.4 mm as comparative objects. In this simulation, the flow rate of the raw material gas introduced to the tournament nozzle, the flow rate of the raw material gas introduced to the dispersion nozzle having an inner diameter of 16 mm, and the flow rate of the raw material gas introduced to the dispersion nozzle having an inner diameter of 6.4 mm are set to the same flow rate. Further, a case where hexachlorodisilane (HCD) gas is used as the raw material gas is analyzed.

Figure 10:
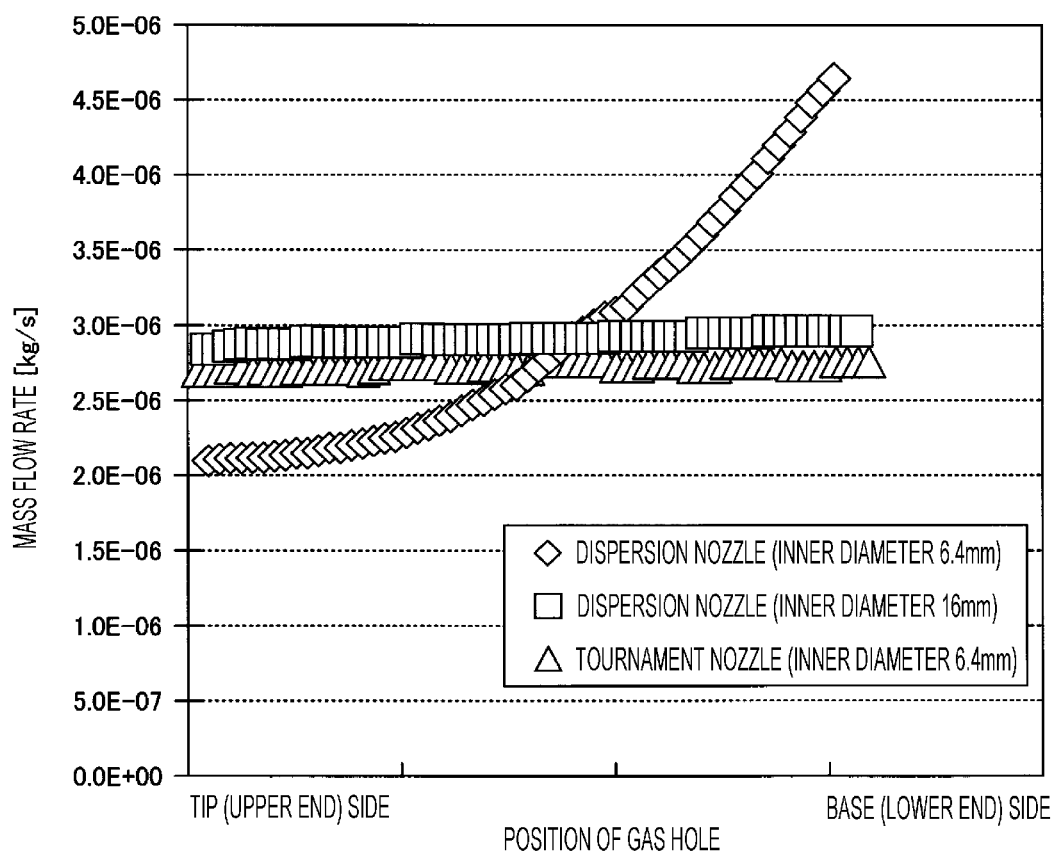
FIG. 10 is a diagram illustrating the result of analyzing the distribution of the mass flow rate of a HCD gas.

FIG. 10 is a diagram illustrating the result of analyzing the distribution of the mass flow rate of a HCD gas. In FIG. 10, the horizontal axis represents the position of the gas hole, and the vertical axis represents the mass flow rate [kg/s] of the HCD gas. Further, in FIG. 10, the rhombic mark indicates the result of the dispersion nozzle having an inner diameter of 6.4 mm, the square mark indicates the result of the dispersion nozzle having an inner diameter of 16 mm, and the triangular mark indicates the result of the tournament nozzle having an inner diameter of 6.4 mm.

As illustrated in FIG. 10, the tournament nozzle and the dispersion nozzle having an inner diameter of 16 mm are illustrated as having substantially the same mass flow rate in the entire range from the tip (upper end) to the base (lower end) of the nozzle. Meanwhile, in the dispersion nozzle having an inner diameter of 6.4 mm, the mass flow rate increases from the tip toward the base of the nozzle.

Figure 11:
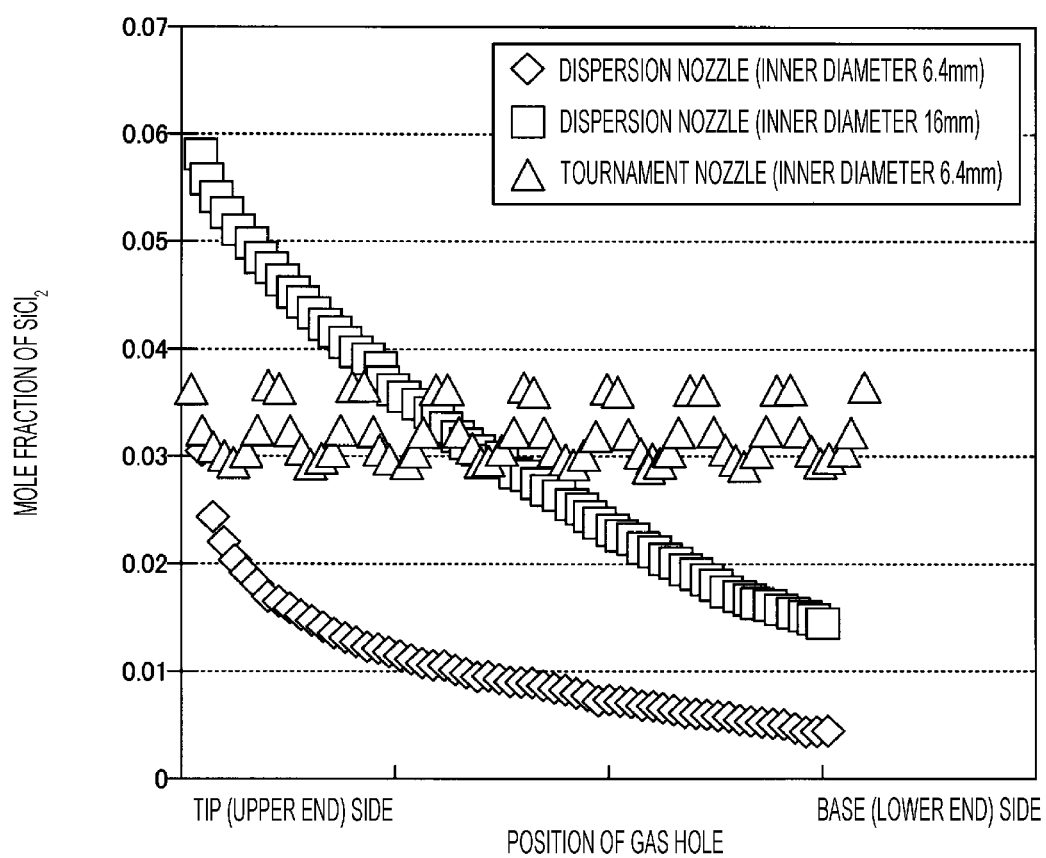
FIG. 11 is a diagram illustrating the result of analyzing the distribution of the mole fraction of $SiCl_2$.

FIG. 11 is a diagram illustrating the result of analyzing the distribution of the mole fraction of $SiCl_2$. FIG. 11, the horizontal axis represents the position of the gas hole, and the vertical axis represents the mole fraction of $SiCl_2$. Further, in FIG. 11, the rhombic mark indicates the result of the dispersion nozzle having an inner diameter of 6.4 mm, the square mark indicates the result of the dispersion nozzle having an inner diameter of 16 mm, and the triangular mark indicates the result of the tournament nozzle having an inner diameter of 6.4 mm.

As illustrated in FIG. 11, in the tournament nozzle, the mole fraction of $SiCl_2$ is included within the range from 0.025 to 0.04 in the entire range from the tip to the base of the nozzle, so that a variation in the decomposition degree of the HCD gas is small. Meanwhile, in the dispersion nozzle having an inner diameter of 6.4 mm, the mole fraction of $SiCl_2$ at the tip of the nozzle is 0.03, and the mole fraction of $SiCl_2$ at the base of the nozzle is 0.003, so that the mole fraction of $SiCl_2$ is reduced from the tip toward the base of the nozzle. Further, in the dispersion nozzle having an inner diameter of 16 mm, the mole fraction of $SiCl_2$ at the tip of the nozzle is 0.58, and the mole fraction of $SiCl_2$ at the base of the nozzle is 0.14, so that the mole fraction of $SiCl_2$ is reduced from the tip toward the base of the nozzle.

It is found from the results of FIGS. 10 and 11 described above that the use of the tournament nozzle may realize the uniform mass flow rate of the HCD gas in the entire range from the tip to the base of the nozzle and may reduce a variation in the decomposition degree of the HCD gas. Meanwhile, it is found that, when the dispersion nozzle is used, the uniformity of the mass flow rate of the HCD gas may be increased by increasing the inner diameter from 6.4 mm to 16 mm, but a variation in the decomposition degree of the HCD gas is increased. That is, it is found that, when the dispersion nozzle is used, the uniformity of the mass flow rate of the HCD gas and a variation in the decomposition degree of the HCD gas have a trade-off relationship.

In the above-described embodiment, the tournament nozzle 100 is an example of a gas introduction structure.

In the above-described embodiment, descriptions have been made on the case where the raw material gas is supplied from the tournament nozzle, but the present disclosure is not limited thereto. For example, the reactive gas, the etching gas, and the purge gas may be supplied from the tournament nozzle.

In the above-described embodiment, descriptions have been made on the case where the dispersion nozzle is an L-shaped tube, but the present disclosure is not limited thereto. For example, the dispersion nozzle may be a straight tube that extends along the longitudinal direction of an inner tube at the inner side of a sidewall of the inner tube and has a lower end inserted into and supported by a nozzle support (not illustrated).

In the above-described embodiment, descriptions have been made on the case where the processing apparatus is an apparatus that supplies a gas from the dispersion nozzle disposed along the longitudinal direction of the processing container and exhausts the gas from the exhaust slit disposed to face the dispersion nozzle, but the present disclosure is not limited thereto. For example, the processing apparatus may be an apparatus that supplies a gas from a gas nozzle disposed along the longitudinal direction of a boat and exhausts the gas from a gas outlet disposed above or below the boat.

In the above-described embodiment, descriptions have been made on the case where the processing container is a container having a double tube structure having the inner tube and the outer tube, but the present disclosure is not limited thereto. For example, the processing container may be a container having a single tube structure.

In the above-described embodiment, descriptions have been made on the case where the processing apparatus is a non-plasma apparatus, but the present disclosure is not limited thereto. For example, the processing apparatus may be a plasma apparatus such as a capacitively coupled plasma apparatus or an inductively coupled plasma apparatus.

According to the present disclosure, it is possible to uniformly supply a gas to substrates arranged in multiple tiers.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A gas introduction structure comprising:
    an introduction section that partitions an introduction chamber extending in a longitudinal direction of a processing container having a substantially cylindrical shape to supply a gas into the processing container;
    an ejection section that partitions a plurality of ejection chambers each including a plurality of gas holes through which the gas is ejected into the processing container; and
    a branch section that partitions a plurality of branch chambers chamber connected to the introduction chamber through a first communication pipe, branched corresponding to a number of the plurality of ejection chambers in a tournament manner through a plurality of second communication pipes, and connected to the plurality of ejection chambers through a plurality of third communication pipes, wherein each of a plurality of lowest-level branch chambers among the plurality of branch chambers has a symmetrical structure with respect to a horizontal plane including each of the plurality of second communication pipes.

2. The gas introduction structure of claim 1, wherein the plurality of ejection chambers are arranged along the longitudinal direction of the processing container.

3. The gas introduction structure of claim 1, wherein the number of the plurality of ejection chambers is a power of two.

4. The gas introduction structure of claim 1, wherein the plurality of gas holes are arranged at intervals along the longitudinal direction of the processing container.

5. The gas introduction structure of claim 1, wherein the plurality of gas holes are oriented toward a center of the processing container.

6. The gas introduction structure of claim 1, wherein each of the plurality of branch chambers has a same conductance of a path from the introduction chamber to each of the plurality of ejection chambers.

7. The gas introduction structure of claim 1, wherein the introduction section, the branch section, and the ejection section are arranged in an order along a circumferential direction of the processing container.

8. The gas introduction structure of claim 1, wherein the branch section and the ejection section are arranged around the introduction section.

9. The gas introduction structure of claim 1, wherein a plurality of substrates is accommodated in the processing chamber in multiple tiers at intervals in the longitudinal direction of the processing container.

10. The gas introduction structure of claim 1, wherein the processing container is heated by a heater having a substantially cylindrical shape and provided around the processing container.

11. A processing apparatus comprising:

a processing container having a substantially cylindrical shape; and a gas introduction body extending in a longitudinal direction of the processing container and configured to supply a gas into the processing container, wherein the gas introduction body includes:

an introduction section that partitions an introduction chamber;

an ejection section that partitions a plurality of ejection chamber, each including a plurality of gas holes through which the gas is ejected into the processing container; and a branch section that partitions a plurality of branch chambers connected to the introduction chamber through a first communication pipe, branched corresponding to a number of the plurality of ejection chambers in a tournament manner through a plurality of second communication pipes, and connected to the plurality of ejection chambers through a plurality of third communication pipes, wherein each of a plurality of lowest-level branch chambers among the plurality of branch chambers has a symmetrical structure with respect to a horizontal plane including each of the plurality of second communication pipes.

12. The gas introduction structure of claim 1, wherein a highest-level branch chamber among the plurality of branch chambers has a symmetrical structure with respect to a horizontal plane including the first communication pipe.

13. The processing apparatus of claim 11, wherein a highest-level branch chamber among the plurality of branch chambers has a symmetrical structure with respect to a horizontal plane including the first communication pipe.

* * * * *